United States Patent
Durgam et al.

(10) Patent No.: US 9,535,786 B2
(45) Date of Patent: Jan. 3, 2017

(54) ADAPTIVE TARGETING OF READ LEVELS IN STORAGE DEVICES

(71) Applicant: HGST Netherlands B.V., Amsterdam (NL)

(72) Inventors: Aniryudh Reddy Durgam, San Diego, CA (US); Haritha Uppalapati, San Diego, CA (US); Kiran Yalamanchi, San Diego, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/617,231

(22) Filed: Feb. 9, 2015

(65) Prior Publication Data

US 2016/0232054 A1    Aug. 11, 2016

(51) Int. Cl.
- *G06F 11/10* (2006.01)
- *G11C 11/56* (2006.01)
- *G11C 29/52* (2006.01)

(52) U.S. Cl.
CPC ....... *G06F 11/1048* (2013.01); *G06F 11/1068* (2013.01); *G11C 29/52* (2013.01); *G11C 11/5628* (2013.01)

(58) Field of Classification Search
CPC .. G06F 11/1048; G06F 11/1068; G11C 29/52; G11C 11/5628
See application file for complete search history.

(56) References Cited

U.S. PATENT DOCUMENTS

| | | | |
|---|---|---|---|
| 8,023,323 B2 | 9/2011 | Kang et al. | |
| 8,040,725 B2 | 10/2011 | Kang | |
| 8,040,737 B2 | 10/2011 | Alrod et al. | |
| 8,125,827 B2 | 2/2012 | Park | |
| 8,644,099 B2 | 2/2014 | Cometti et al. | |
| 8,645,793 B2 | 2/2014 | Wu et al. | |
| 2010/0020611 A1* | 1/2010 | Park | G06F 11/1068 365/185.09 |
| 2011/0280083 A1* | 11/2011 | Choi | G11C 11/5628 365/185.19 |
| 2013/0047045 A1* | 2/2013 | Hu | G06F 11/1048 714/708 |

(Continued)

OTHER PUBLICATIONS

Qin et al., "Towards Minimizing Read Time for Nand Flash," IEEE Global Communications Conference (GLOBECOM), Jan. 2012, 6 pp.

*Primary Examiner* — Richard Elms
*Assistant Examiner* — Ajay Ojha
(74) *Attorney, Agent, or Firm* — Shumaker & Sieffert, P.A.

(57) ABSTRACT

A storage device may include a controller and a plurality of memory devices logically divided into a plurality of pages. Each page in the plurality of pages may include a plurality of bits. The controller may be configured to: apply a read level to a control gate of a transistor for each respective bit in the plurality of bits; determine, based on an amount of current that flows through the transistor, a respective value for each bit from the respective plurality of bits; determine, based on the respective values for the respective plurality of bits, an error ratio that indicates a number of bits from the plurality of bits that are written as a first bit value but are incorrectly read as a second bit value relative to a number of bits from the plurality of bits that are written as the second bit value but are incorrectly read as the first bit value; and adjust, based on the error ratio, the read level.

20 Claims, 3 Drawing Sheets

(56) References Cited

U.S. PATENT DOCUMENTS

2014/0068365 A1    3/2014  Chen et al.
2016/0042797 A1*   2/2016  Kim ..................... G11C 16/26
                                                      714/764

\* cited by examiner

ADAPTIVE TARGETING OF READ LEVELS IN STORAGE DEVICES

TECHNICAL FIELD

This disclosure relates to logical storage management, and more particularly, to logical storage management for solid state drives.

BACKGROUND

Solid-state drives (SSDs) may be used in computers in applications where relatively low latency and high capacity storage are desired. For example, SSDs may exhibit lower latency, particularly for random reads and writes, than hard disk drives (HDDs). This may allow greater throughput for random reads from and random writes to a SSD compared to a HDD. Additionally, SSDs may utilize multiple, parallel data channels to read from and write to memory devices, which may result in high sequential read and write speeds.

SSDs may utilize non-volatile memory devices, such as flash memory devices, which continue to store data without requiring persistent or periodic power supply. Flash memory devices are written and erased by applying a voltage to the memory cell. The voltage used to erase the flash memory devices may be relatively high, and may cause physical changes to the flash memory cell over many erase operations. In addition, flash memory cells may simply wear out over time as the transistors in a flash memory cell lose the ability to hold a charge. Whether flash memory cells lose their ability to store charge due to use or age, the loss of charge reduces or eliminates the ability to accurately read data as it was written to the flash memory cells.

SUMMARY

In one example, a data storage device includes a controller and memory devices. The memory devices are logically divided into a plurality of pages, each page of the plurality of pages including a respective plurality of bits. The controller is configured to: apply a read level to a control gate of a transistor for each respective bit in the plurality of bits; determine, based on an amount of current that flows through the transistor, a respective value for each bit from the respective plurality of bits; determine, based on the respective values for the respective plurality of bits, an error ratio that indicates a number of bits from the plurality of bits that are written as a first bit value but are incorrectly read as a second bit value relative to a number of bits from the plurality of bits that are written as the second bit value but are incorrectly read as the first bit value; and adjust, based on the error ratio, the read level.

In another example, a method includes applying, by a controller of a storage device, a read level to a control gate of a transistor for each respective bit in a plurality of bits; determining, by the controller and based on an amount of current that flows through the transistor, a respective value for each bit from the plurality of bits; determining, by the controller and based on the respective values for the respective plurality of bits, an error ratio that indicates a number of bits from the plurality of bits that are written as a first bit value but are incorrectly read as a second bit value relative to a number of bits from the plurality of bits that are written as the second bit value but are incorrectly read as the first bit value; and adjusting, by the controller and based on the error ratio, the read level.

In another example, a computer-readable storage medium stores instructions that, when executed, cause one or more processors of a data storage device to: apply a read level to a control gate of a transistor for each respective bit in the plurality of bits; determine, based on an amount of current that flows through the transistor, a respective value for each bit from the respective plurality of bits; determine, based on the respective values for the respective plurality of bits, an error ratio that indicates a number of bits from the plurality of bits that are written as a first bit value but are incorrectly read as a second bit value relative to a number of bits from the plurality of bits that are written as the second bit value but are incorrectly read as the first bit value; and adjust, based on the error ratio, the read level.

In another example, a system includes means for applying, by a controller of a storage device, a read level to a control gate of a transistor for each respective bit in a plurality of bits; means for determining, by the controller and based on the amount of current that flows through the transistor, a respective value for each bit from the plurality of bits; means for determining, by the controller and based on the respective values for the respective plurality of bits, an error ratio that indicates a number of bits from the plurality of bits that are written as a first bit value but are incorrectly read as a second bit value relative to a number of bits from the plurality of bits that are written as the second bit value but are incorrectly read as the first bit value; and means for adjusting, by the controller and based on the error ratio, the read level.

The details of one or more examples are set forth in the accompanying drawings and the description below. Other features, objects, and advantages will be apparent from the description and drawings, and from the claims.

DETAILED DESCRIPTION

The disclosure describes techniques for adjusting a read level applied to a control gate of cells in a storage device, such as a solid state drive (SSD). A storage device may include memory devices that each includes a plurality of blocks, each block including memory cells that store data. In some examples, a controller in the storage device may perform a read operation by applying a read level voltage to a control gate for each transistor in a memory cell. If the read level is sufficient to close the transistor, current may flow. Based on the amount of current flow through the transistor, the controller may determine the bit values and whether there are any bit value errors. The controller may determine an error ratio, which may be expressed as the number of bits that were written as a logical zero (L0) but were read as a logical one (L1) compared to the number of bits that were written as a logical one (L1) but were read as a logical zero (L0)). After determining the error ratio, the controller may compare the error ratio a threshold ratio and a limit ratio. If the error ratio does not satisfy the threshold ratio, the controller may determine that the read level is acceptable and does not need to be adjusted. However, if the controller determines that the error ratio satisfies the threshold ratio, the controller may determine that the read level should be adjusted. If the controller determines that the error ratio does not satisfy the limit ratio, the controller may adjust (e.g., increment, decrement, etc.) the threshold voltage. However, if the controller determines that the error ratio satisfies the limit ratio, the controller may determine that a read calibration is needed and initiate a read calibration process.

As techniques of this disclosure may enable the controller to frequently compare the error ratio to a threshold ratio and limit ratio, the techniques of this disclosure may enable the controller may make adjustments to the read level, which may reduce the frequency and number of read calibrations that must be performed. By reducing the number and/or frequency of read calibrations, techniques of this disclosure may reduce the amount of power consumed by the device and increase performance of the storage device.

Figure 1:
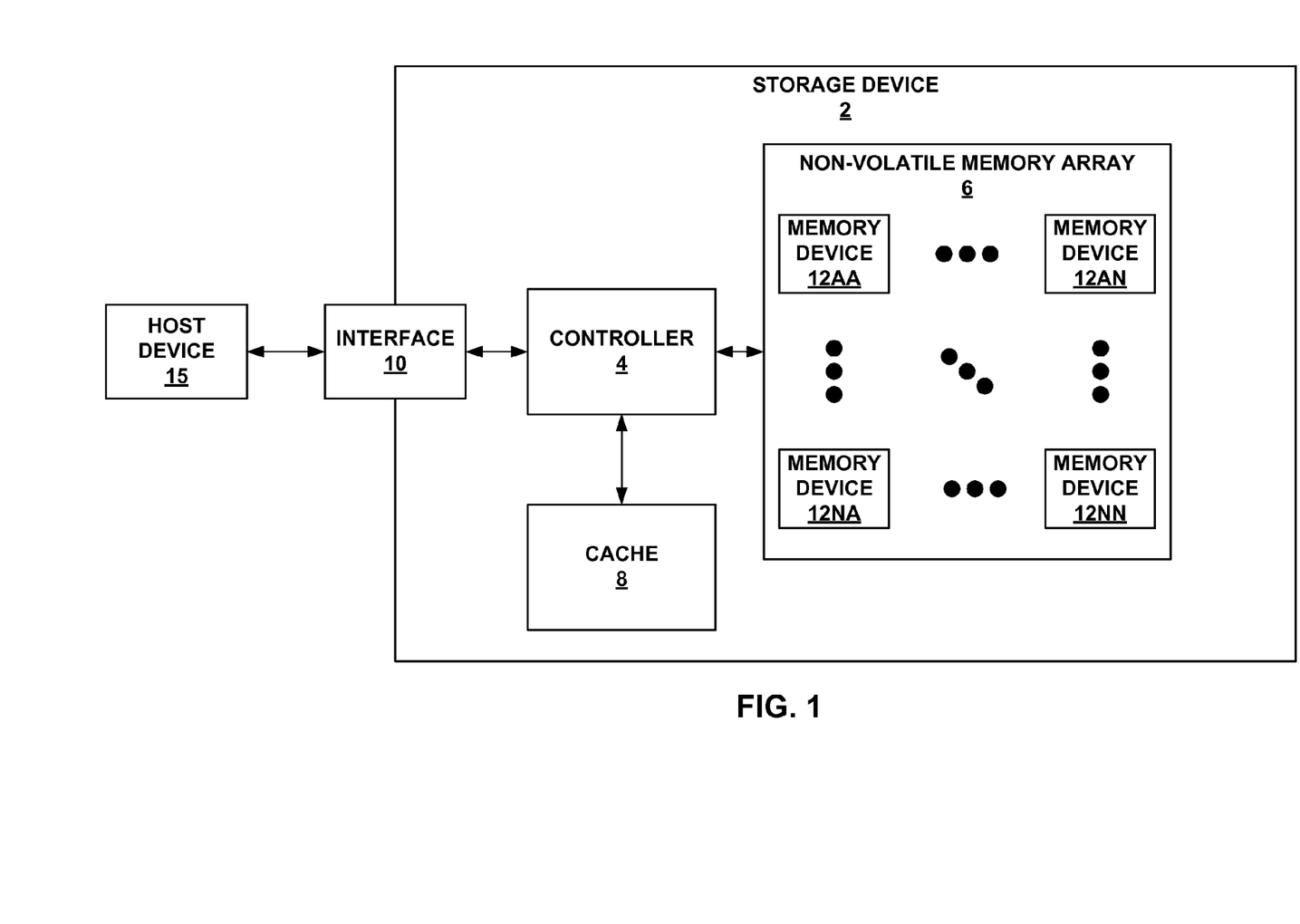
FIG. 1 is a conceptual and schematic block diagram illustrating an example system including a storage device connected to a host device.

FIG. 1 is a conceptual and schematic block diagram illustrating an example system including storage device 2 connected to host device 15. Host device 15 may utilize non-volatile memory devices included in storage device 2 to store and retrieve data. Host device 15 may include any computing device, including, for example, a computer server, a network attached storage (NAS) unit, a desktop computer, a notebook (e.g., laptop) computer, a tablet computers, a set-top box, a mobile computing device such as a "smart" phone, a television, a camera, a display device, a digital media player, a video gaming console, a video streaming device, or the like.

As illustrated in FIG. 1 storage device 2 may include controller 4, non-volatile memory array 6 (NVMA 6), cache 8, and interface 10. In some examples, storage device 2 may include additional components not shown in FIG. 1 for sake of clarity. For example, storage device 2 may include power delivery components, including, for example, a capacitor, super capacitor, or battery; a printed board (PB) to which components of storage device 2 are mechanically attached and which includes electrically conductive traces that electrically interconnect components of storage device 2; or the like. In some examples, storage device 2 includes a solid state drive (SSD).

Storage device 2 may include interface 10 for interfacing with host device 15. Interface 10 may provide a mechanical connection, and electrical connection, or both to host device 15. Interface 10 may include one or both of a data bus for exchanging data with host device 15 and a control bus for exchanging commands with host device 15. Interface 10 may operate in accordance with any suitable protocol. For example, interface 10 may operate in accordance with one or more of the following protocols: advanced technology attachment (ATA) (e.g., serial-ATA (SATA), and parallel-ATA (PATA)), Fibre Channel, small computer system interface (SCSI), serially attached SCSI (SAS), peripheral component interconnect (PCI), and PCI-express. The electrical connection of interface 10 (e.g., the data bus, the control bus, or both) is electrically connected to controller 4, providing electrical connection between host device 15 and controller, allowing data to be exchanged between host device 15 and controller 4. Storage device 2 may include cache 8 which may be electrically connected to controller 4. Cache 8 may include a memory device for temporary storage of data that is likely to be used by host device 15.

Storage device 2 may include NVMA 6 which may include a plurality of memory devices 12AA-12NN (collectively, "memory devices 12") which may each be configured to store and/or retrieve data. For instance, a memory device of memory devices 12 may receive data and a message from controller 4 that instructs the memory device to store the data. Similarly, the memory device of memory devices 12 may receive a message from controller 4 that instructs the memory device to retrieve data. In some examples, each of memory devices 12 may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, memory devices 12 may include flash memory devices. Flash memory devices may include NAND or NOR based flash memory devices. Memory device 12 may include blocks, each block including a plurality of pages. Each block of blocks may include a plurality of NAND cells. Rows of NAND cells may be electrically connected using a word line to define a page (e.g., one page of the plurality of pages). Respective cells in each of a plurality of pages may be electrically connected to respective bit lines. As further discussed below, controller 4 may write data to and read data from NAND flash memory devices at the page level and erase data from NAND flash memory devices at the block level. Memory device 12 may store data based on a charge contained in a floating gate of a transistor for each flash memory cell.

Controller 4 may manage the write and read operations of storage device 2. Controller 4 may apply a read level voltage to the control gate of every transistor in a given page of memory cells. If the read level is above a threshold voltage, the transistor closes and current flows through the memory device 12. Thus, controller 4 may determine the bit value based on whether there is a current flow through memory device 12 (or based on the amount of current flow in a multi-level cell (MLC)). As data is written to and read from memory devices 12, the floating gate of the transistor for a respective flash memory cell may lose its ability to hold a charge. The amount of charge on a flash memory cell changes the read level that must be applied to the control gate of the transistor to determine the bit value of the flash memory cell. If a flash memory cell can no longer hold a charge properly, the read level that would not normally close the transistor may now close the transistor and allow current to flow through the transistor. Since controller 4 determines the bit value based on the amount of current passing through the transistor, controller 4 may read the bit value incorrectly.

Controller 4 may include error decoders to compensate for these bit errors. In some examples, controller 4 may periodically change the read level by performing a read calibration. In general, to perform a read calibration, controller 4 suspends normal read and write operations and, instead, performs a series of read operations solely to determine and adjust read levels. In this way, performing a read calibration may allow controller 4 to determine a read level that reduces the number of read errors. However, invoking a read calibration may hinder drive performance because the read calibration suspends normal read and write operations and requires a large number of reads to properly calibrate the read level. Further, as cells continue to age and degrade, the controller may need to perform calibrations more frequently. The current disclosure describes techniques for adjusting read levels using data that is already read as part of normal read operations and dynamically checking the read levels on each read issued by host device 15. In this way, techniques of this disclosure may enable controller 4 to adjust the read level more efficiently than performing read calibrations, which may improve drive performance and reduce the number of bit errors.

In some examples, controller 4 may adjust the read level for subsequent reads. Adjusting the read level may cause some floating gates that were written as a first bit value (e.g., logical 0) to conduct a current and be read as a second bit value (e.g., logical 1) while applying the same read level may cause some gates that were written as a second bit value (e.g., logical 1) not to conduct a current and be read as a first bit value (e.g., logical 0). Thus, controller 4 may adjust the read level to compensate for flash memory cells that have lost their ability to hold a charge. Controller 4 may increase or decrease the read level voltage applied to the cells in an attempt to reduce the bit errors.

Figure 2:
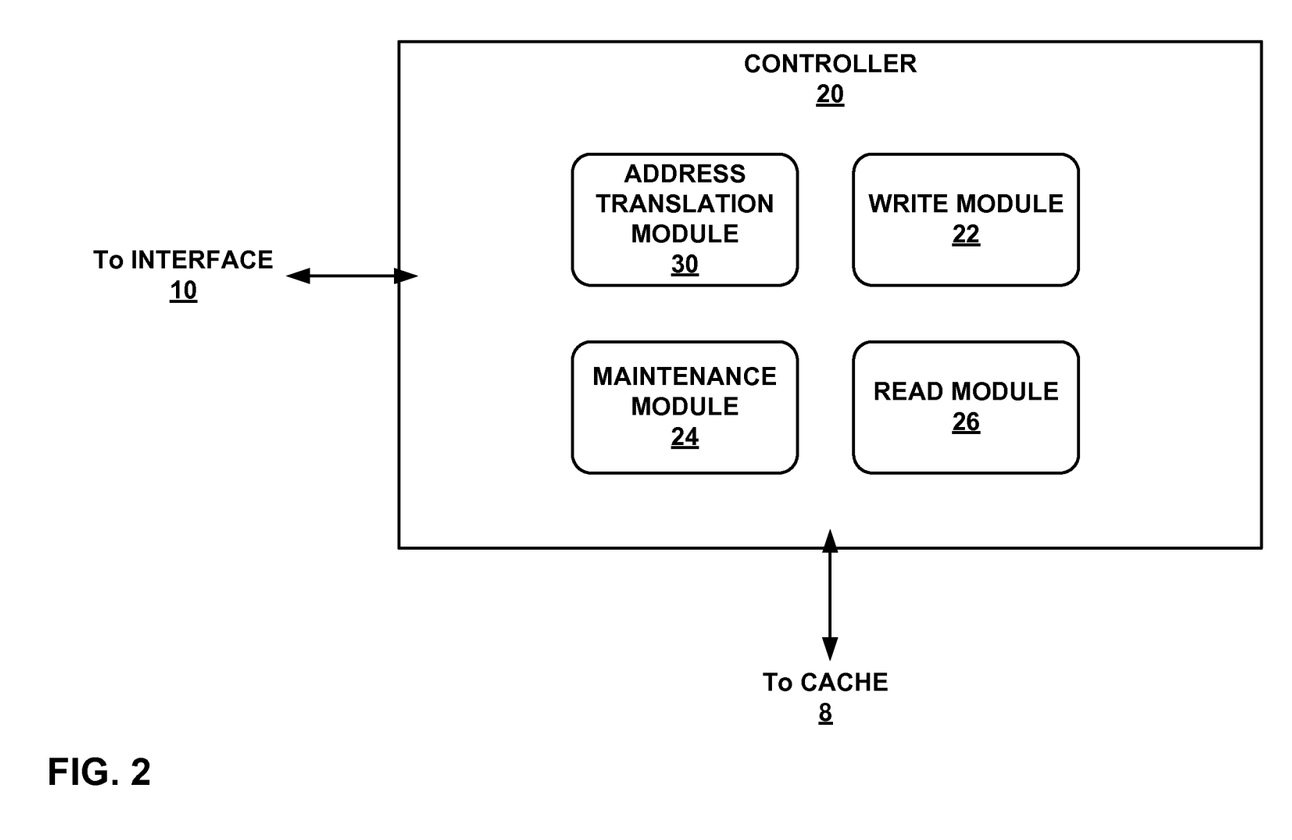
FIG. 2 is a conceptual and schematic block diagram illustrating an example controller.

FIG. 2 is a conceptual and schematic block diagram illustrating an example controller 20, which may be an example of controller 4 in FIG. 1. In some examples, controller 20 may include write module 22, maintenance module 24, read module 26, and address translation module 30. In other examples, controller 20 may include additional modules or hardware units, or may include fewer modules or hardware units. Controller 20 may include a microprocessor, digital signal processor (DSP), application specific integrated circuit (ASIC), field programmable gate array (FPGA), or other digital logic circuitry.

Controller 20 may interface with the host device 15 via interface 10 and manage the storage of data to and the retrieval of data from memory devices 12. For example, write module 22 of controller 20 may manage writes to memory devices 12. For example, write module 22 may receive a message from host device 15 via interface 10 instructing storage device 2 to store data associated with a logical address and the data. Write module 22 may manage writing of the data to memory devices 12.

In order to write a bit with a logical value of 0 (charge) to a bit with a previous logical value of 1 (uncharged), a large current is used. This current may be sufficiently large that it may cause inadvertent changes to the charge of adjacent flash memory cells. To protect against inadvertent changes, an entire block of flash memory cells may be erased to a logical value of 1 (uncharged) prior to writing any data to cells within the block. Because of this, flash memory cells may be erased at the block level and written at the page level.

Thus, to write even an amount of data that would consume less than one page, controller 20 may cause an entire block to be erased. This may lead to write amplification, which refers to the ratio between the amount of data received from host device 15 to be written to memory devices 12 and the amount of data actually written to memory devices 12. Write amplification contributes to faster wearing of the flash memory cells than would occur with no write amplification. Wear to flash memory cells may occur when flash memory cells are erased due to the relatively high voltages used to erase the flash memory cells. Over a plurality of erase cycles, the relatively high voltages may result in physical changes to the flash memory cells. Eventually, the flash memory cells may wear out, such that data may no longer be written to the cells.

Maintenance module 24 may be configured to perform operations related to maintaining performance and extending the useful life of storage device 2 (e.g., memory devices 12). For example, maintenance module 24 may implement at least one of wear leveling or garbage collection. While maintenance module 24 may extend the life of a drive, some flash memory cells may lose sufficient amounts of charge that the read process no longer interprets the bit value of a given memory cell properly.

Read module 26 of controller 20 may manage reads from memory devices 12. For example, read module 26 may receive a message from host device 15 via interface 10 instructing storage device 2 to read data associated with a logical address and the data. For example, read module 26 may communicate with address translation module 20, which manages translation between logical addresses used by host device 15 to manage storage locations of data and physical block addresses used by read module 26 to direct reading of data from memory devices. Address translation module 30 of controller 20 may utilize a flash translation layer or table that translates logical addresses (or logical block addresses) of data stored by memory devices 12 to physical block addresses of data stored by memory devices 12. Read module 26 may utilize physical block addresses to control reading of data from memory devices 12.

Read module 26 of controller 20 may perform one or more operations to read data from memory devices 12. For example, read module 26 may cause the read level to be applied to each of the control gates corresponding to the bits in a particular page of memory. In some examples, such as a single-level cell (SLC), if the floating gate for a given bit does not have a charge, applying the read level to the control gate causes the transistor to close so that current flows through the transistor. In an SLC, read module 26 determines the bit value based on the absence or presence of the current (e.g., the bit value is treated as a logical 1 if there is current flow but is treated as a logical 0 if there not a current flow). In a multi-level cell (MLC), read module 26 determines the bit value based on the amount of current.

However, if the floating gate for a given bit has a charge, current will flow only if the read level is large enough to close the transistor. If the read level is not large enough to close the transistor, current may not flow through the transistor. In examples including SLC memory, read module 26 will interpret the lack of current and determine that the bit value should be treated as a logical 0. If the read level is large enough to close the transistor, current will flow through the transistor. Thus, in some examples, read module 26 will determine that the bit value should be treated as a logical 0. In examples including MLC memory, read module 26 may determine the bit value based on the amount of current flow through the transistor. However, as noted above, the ability of the floating gate to accurately hold a charge will degrade over time. As a result, the read level required to close the transistor may change over time.

For example, assume an SLC where a bit was originally written as a logical 0 and a threshold voltage of 3.0 volts (i.e., the transistor will not close unless a read level of 3.0 volts is applied to the gate). If read module 26 applies a read level of 2.0 volts to the control gate, the transistor will not close, current will not flow, and read module 26 will determine that the bit stores a logical 0. However, as the floating gate loses its ability to hold a charge, the memory cell may degrade such that threshold voltage decreases to 1.5 volts (i.e., the transistor may close at only 1.5 volts). Thus, applying a read level of 2.0 volts will cause the transistor to close, current to flow, and read module 26 will determine that the bit stores a logical 1 when in fact the bit was written to store a logical 0. The example voltages used here are intended to illustrate the mechanics of read module 26. In some examples, other voltages may be used. Further, in some examples, the range of the relevant voltage may be narrower (e.g., the threshold voltage may originally be 2.50 but may degrade to only 2.45 volts, and the read level may be 2.47 volts).

Read module 26 may determine whether there are any bit value errors. Some of the bit value errors may be caused by bits that were originally written as a logical 0 but are read as a logical 1 (denoted by $L_0L_1$). Some of the bit value errors may be caused by bits that were originally written as a logical 1 but are read as a logical 0 (denoted by $L_1L_0$.

Based on the determined bit value errors, read module 26 may determine an error ratio. The error ratio refers to the number of bits that were written as a zero (L0) but were read as a one (L1) compared to the number of bits that were written as a one (L1) but were read as a zero (L0). The error ratio may be expressed by the formula:

Error Ratio=$L_0L_1/L_1L_0$

For example, read module 26 may determine that there are 201 bits that were written as a logical 0 but were read as a logical 1 ($L_0L_1$=201). Likewise, read module 26 may determine that there were 100 bits that were written as a logical 1 but were read as a logical 0 ($L_1L_0$=100). In this example, the error ratio is calculated as 201/100 or 2.01. In some examples the error ratio may be the inverse of Equation 1 above. Ideally, the error ratio will be as close to 1 as possible to minimize the number of bit value errors.

Read module 26 may compare the error ratio to a threshold ratio. In some examples, the threshold ratio may be 2.00. In some examples, the threshold ratio may be 0.50. In some examples, there may be more than one threshold ratio, for example, an upper threshold ratio and a lower threshold ratio. In some examples, the upper threshold ratio and lower threshold ratio may be inversely related. If the error ratio does not satisfy the threshold ratio, read module 26 may determine that the read level is acceptable and does not need to be adjusted. For example, if the threshold ratio is 2.00 and the error ratio is 1.99, the error ratio is far from the ideal ratio of 1 but it has not crossed the threshold ratio. Thus, read module 26 may determine that no action is necessary. However, if the threshold ratio is 2.00 and the error ratio is 2.01, read module 26 may determine that the error ratio satisfies the threshold ratio and that further action is advisable. In some examples, if the threshold ratio is 0.50 and the error ratio is 0.51, the error ratio is far from the ideal ratio of 1.0 but it has not crossed the threshold ratio. Thus, read module 26 may determine that no action is necessary. However, if the threshold ratio is 0.50 and the error ratio is 0.49, controller 4 may determine that the error ratio satisfies the threshold ratio and that further action is advisable. In some examples, read module 26 may compare the error ratio to two threshold ratios (e.g., 0.50 and 2.00) and if the error ratio satisfies either threshold (e.g., is less than 0.50 or is greater than 2.00), read module 26 may determine that further action is advisable.

If read module 26 determines that the error ratio satisfies the threshold ratio, the controller may compare the error ratio to a limit ratio. In some examples, the limit ratio may be 5.00. In some examples, the limit ratio may be 0.20. In some examples, there may be more than one limit ratio, for example, an upper limit ratio and a lower limit ratio. In some examples, the upper limit ratio and lower threshold ratio may be inversely related. If the error ratio does not satisfy the limit ratio, read module 26 may determine that the read level should be adjusted. For example, if the limit ratio is 5.00, the threshold ratio is 2.00, and the error ratio is 4.90, the error ratio has crossed the threshold ratio but has not crossed the limit ratio. Thus, read module 26 may determine that it should adjust the read level. However, if the limit ratio is 5.00, the threshold ratio is 2.00 and the error ratio is 5.10, read module 26 may determine that the error ratio satisfies the limit ratio and trigger a read calibration. In some examples, if the limit ratio is 0.20, the threshold ratio is 0.50, and the error ratio is 0.21, read module 26 may determine that the error ratio satisfies the threshold ratio but has not crossed the limit ratio. Thus, read module 26 may determine that it should adjust the read level. However, if the limit ratio is 0.20 and the error ratio is 0.19, read module 26 may determine that the error ratio satisfies the limit ratio and trigger a read calibration. In some examples, read module 26 may compare the error ratio at two limit ratios (e.g., 0.20 and 5.00) and if the error ratio satisfies either limit ratio (e.g., is less than 0.20 or is greater than 5.00), read module 26 may trigger a read calibration.

If read module 26 determines that the error ratio satisfies the threshold ratio but does not satisfy the limit ratio, read module 26 may adjust the read level. As one example, assume the following conditions:

$L_0L_1$=210
$L_1L_0$=100
Error Ratio=$L_0L_1/L_1L_0$=2.10
Ideal Ratio=1.00
Threshold Ratio=2.00
Limit Ratio=5.00

In this example, read module 26 will determine that the error ratio satisfies the threshold ratio because the error ratio has drifted from the ideal ratio and surpassed the threshold ratio. However, read module 26 will also determine that the error ratio does not satisfy the limit ratio because the error ratio has not surpassed the limit ratio. Thus, read module 26 may adjust the read level to achieve a better error ratio.

For example, read module 26 may adjust the read level, from 2.00 volts to 1.95 volts. In this example, reducing the read level to 1.95 volts may prevent some transistors from erroneously closing (and conducting a current) so that read module 26 correctly interprets the bit value as a logical 0 (as it was originally stored). However, continuing the example, reducing the read level from 2.00 to 1.95 may cause some bits that were originally written as a logical 1 to be interpreted as a logical 0 because the updated read level may be insufficient to close the respective transistors. Since these transistors can no longer close, current will not flow, and thus read module 26 may interpret the bit value to be a logical 0 when it was originally written as a logical 1. As a result, read module 26 may keep track of the bit errors, determine an error ratio, and adjust the read level frequently.

Read module 26 may determine the error ratio and adjust the read level at various intervals, such as on a regular periodic basis (e.g., once per day), every time read module 26 performs a read operation, when drive 2 is in an idle state (e.g., overnight or during hours the drive is typically not in use), etc. In some examples, read module 26 may be configured to determine the error ratio and adjust the read level when drive 2 performs a read operation initiated by a user (i.e., when the user requests data, drive 2 performs a read operation and controller 4 determines the error ratio). However, read module 26 may be configured to initiate a random read operation, and determine the error ratio and adjust the read level based on the random read operation.

In some examples, read module 26 may adjust the read level in relatively large increments (e.g., 0.1 volts) or relatively small increments (e.g., 0.001 volts). In some examples, read module 26 may be configured to adjust the read level in fixed increments. However, read module 26 may be configured to adjust the read level in variable increments. In some examples, the magnitude of the adjustment in the read level may be based upon the magnitude of the error ratio. For example, if the error ratio is 3.00 and the threshold ratio is 2.00, read module 26 may be configured to adjust the read level by 0.05 volts. But, if the error ratio is 2.50 and the threshold ratio is 2.00, read module 26 may be configured to adjust the read level by a smaller amount, for example 0.01 volts.

Figure 3:
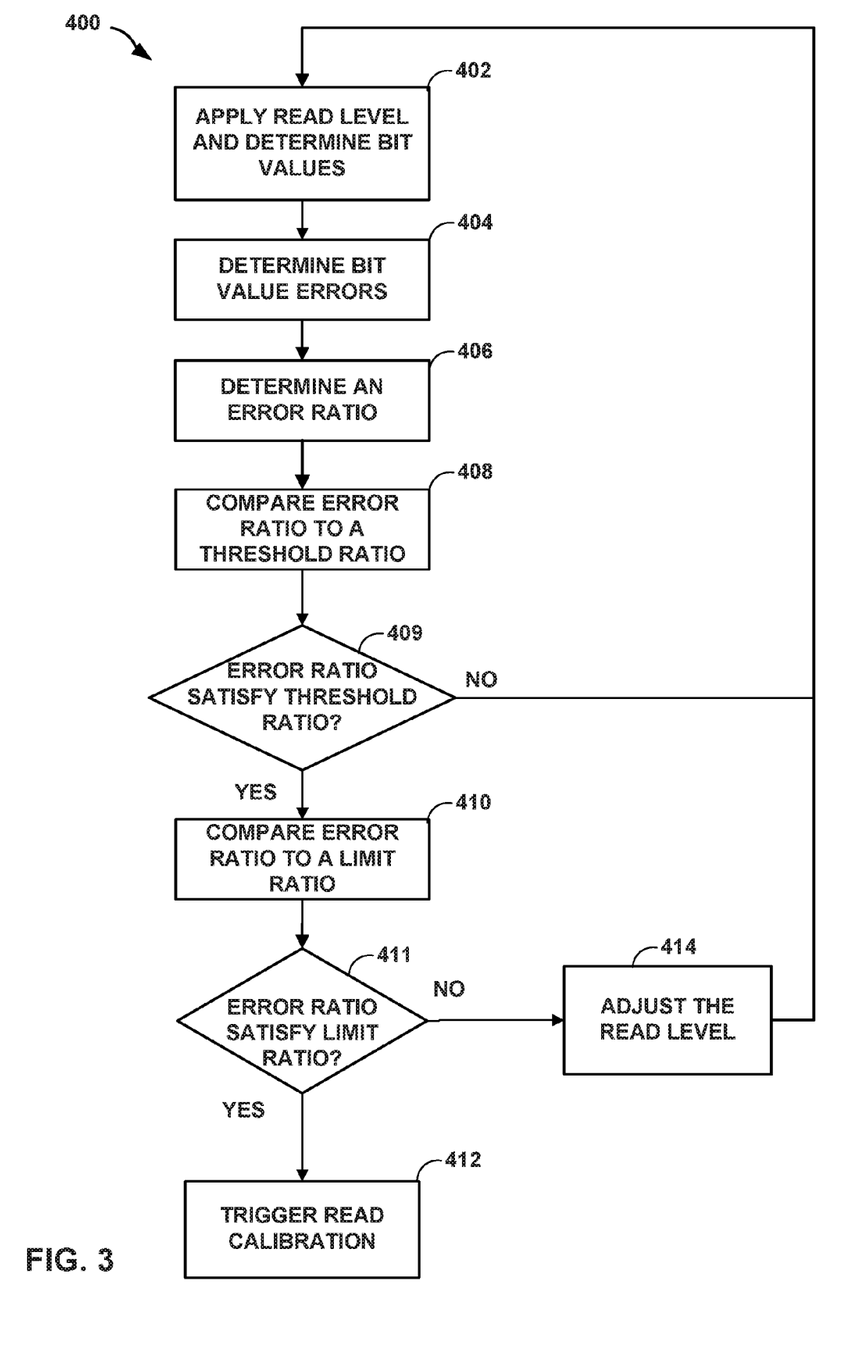
FIG. 3 is a flow diagram illustrating an example method for adjusting the read level.

FIG. 3 is a flow diagram illustrating an example method for adjusting the read level. In some examples, read module 26 may apply a read level to a page of memory to determine the bit value for each of the bits in the page (402). In some examples (e.g., where the memory cell includes an SLC), read module 26 may interpret the bit value for all of the bits in the page being read based on whether current flows through the transistor for each of the respective bits. In some examples (e.g., where the memory cell includes an MLC), read module 26 may interpret the bit value for all of the bits in the page being read based on the amount of current that flows through the transistor for each of the respective bits.

Read module 26 may determine whether there are any bit value errors (404). Some of the bit value errors may be caused by bits that were originally written as a logical 0 but are read as a logical 1 (denoted by $L_0L_1$). Some of the bit value errors may be caused by bits that were originally written as a logical 1 but are read as a logical 0 (denoted by $L_1L_0$).

Read module 26 may determine an error ratio (406). The error ratio refers to the number of bits that were written as a zero (L0) but were read as a one (L1) compared to the number of bits that were written as a one (L1) but were read as a zero (L0).

Read module 26 may compare the error ratio a threshold ratio (408). If the error ratio does not satisfy the threshold ratio, read module 26 may determine that the read level is acceptable and does not need to be adjusted. However, if the error ratio satisfies the threshold ratio, read module 26 may determine that further action is advisable.

If read module 26 determines that the error ratio satisfies the threshold ratio, the controller may compare the error ratio to a limit ratio (410). If read module 26 determines that the error ratio satisfies the limit ratio, read module 26 may trigger a read calibration (412). If read module 26 determines that the error ratio does not satisfy the limit ratio, the read module 26 may make an incremental adjustment to the read level (414). Increasing or decreasing the read level may cause some gates to conduct a current when they did not conduct a current at the previous read level. Likewise, changing the read level may stop current flow in gates that conducted a current the previous read level. Therefore, read module 26 may repeat process 400 periodically to achieve a more desirable error ratio.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various examples have been described. These and other examples are within the scope of the following claims.

What is claimed is:

1. A storage device comprising:
a plurality of memory devices logically divided into a plurality of pages, each page of the plurality of pages including a respective plurality of bits; and
a controller configured to:
apply a read level to a control gate of a transistor for each respective bit in the plurality of bits;
determine, based on an amount of current that flows through the transistor, a respective value for each bit from the respective plurality of bits;
determine, based on the respective values for the respective plurality of bits, an error ratio that indicates a number of bits from the plurality of bits that are written as a first bit value but are incorrectly read as a second bit value relative to a number of bits from the plurality of bits that are written as the second bit value but are incorrectly read as the first bit value;
responsive to determining that the error ratio satisfies a threshold ratio, determine whether the error ratio satisfies a limit ratio;
responsive to determining that the error ratio does not satisfy the limit ratio, adjust, based on the error ratio, the read level; and
responsive to determining that the error ratio satisfies the limit ratio, perform a read calibration.

2. The storage device of claim 1, wherein an amount of current below a threshold current indicates the first bit value and an amount of current above the threshold current indicates the second bit value.

3. The storage device of claim 1,
wherein the threshold ratio is a first threshold ratio, wherein the limit ratio is a first limit ratio, and
wherein the controller is configured to:
responsive to determining that the error ratio satisfies the first threshold ratio and does not satisfy the first limit ratio, adjust the read level by at least decreasing the read level; and
responsive to determining that the error ratio satisfies a second threshold ratio and does not satisfy a second limit ratio, increase the read level.

4. The storage device of claim 3, wherein decreasing the read level includes decreasing the read level by a fixed amount, wherein increasing the read level includes increasing the read level by a fixed amount.

5. The device of claim 3, wherein the first threshold ratio is inversely related to the second threshold ratio.

6. The device of claim 3, wherein the first limit ratio is inversely related to the second limit ratio.

7. The storage device of claim 1, wherein the read level is initialized to a predetermined value.

8. The storage device of claim 1, wherein the controller is configured to determine the error ratio and update the read level in response to determining the respective value for each bit from the plurality of bits.

9. The device of claim 1, wherein a magnitude of the adjustment in the read level is based on a magnitude of the error ratio.

10. The device of claim 1, wherein the controller is configured to determine the error ratio when the device is in an idle state.

11. The device of claim 1, wherein the threshold ratio is a number between a target ratio and the limit ratio, wherein the target ratio is a ratio that indicates the number of bits that are written as the first bit value but are incorrectly read as the second bit value is equal to the number of bits that are written as the second bit value but are incorrectly read as the first bit value.

12. A method comprising:
applying, by a controller of a storage device, a read level to a control gate of a transistor for each respective bit in a plurality of bits;
determining, by the controller and based on an amount of current that flows through the transistor, a respective value for each bit from the plurality of bits;
determining, by the controller and based on the respective values for the respective plurality of bits, an error ratio that indicates a number of bits from the plurality of bits that are written as a first bit value but are incorrectly read as a second bit value relative to a number of bits from the plurality of bits that are written as the second bit value but are incorrectly read as the first bit value;
responsive to determining that the error ratio satisfies a threshold ratio, determining, by the controller, whether the error ratio satisfies a limit ratio;
responsive to determining that the error ratio does not satisfy the limit ratio, adjusting, by the controller and based on the error ratio, the read level; and
responsive to determining that the error ratio satisfies the limit ratio, performing, by the controller, a read calibration.

13. The method of claim 12, wherein determining a respective value for each bit in the plurality of bits includes comparing the amount of current to a threshold, wherein an amount of current below the threshold current indicates the first bit value and an amount of current above the threshold current indicates the second bit value.

14. The method of claim 12,
wherein the threshold ratio is a first threshold ratio,
wherein the limit ratio is a first limit ratio, and
wherein adjusting the read level includes:
responsive to determining that the error ratio satisfies the first threshold ratio and does not satisfy the first limit ratio, decrease, by the controller, the read level; and
responsive to determining that the error ratio satisfies a second threshold ratio and does not satisfy a second limit ratio, increasing, by the controller, the read level.

15. The method of claim 14, wherein decreasing the read level includes decreasing the read level by a fixed amount, wherein increasing the read level includes increasing the read level by a fixed amount.

16. The method of claim 12, further comprising initializing the read level to a predetermined value.

17. The method of claim 12, further comprising determining the error ratio and updating the read level in response to determining the respective value for each bit from the plurality of bits.

18. A non-transitory computer-readable storage medium storing instructions that, when executed, cause one or more processors of a storage device to:
apply a read level to a control gate of a transistor for each respective bit in the plurality of bits;
determine, based on an amount of current that flows through the transistor, a respective value for each bit from the respective plurality of bits;
determine, based on the respective values for the respective plurality of bits, an error ratio that indicates a number of bits from the plurality of bits that are written as a first bit value but are incorrectly read as a second bit value relative to a number of bits from the plurality of bits that are written as the second bit value but are incorrectly read as the first bit value;
responsive to determining that the error ratio satisfies a threshold ratio, determine whether the error ratio satisfies a limit ratio;
responsive to determining that the error ratio does not satisfy the limit ratio, adjust, based on the error ratio, the read level; and
responsive to determining that the error ratio satisfies the limit ratio, perform a read calibration.

19. The non-transitory computer-readable storage medium of claim 18, wherein the threshold ratio is a first threshold ratio, wherein the limit ratio is a first limit ratio, and wherein the non-transitory computer-readable storage medium further comprises instructions that, when executed, configure one or more processors of the storage device to:
responsive to determining that the error ratio satisfies the first threshold ratio and does not satisfy the first limit ratio, adjust the read level by at least decreasing the read level,
and
responsive to determining that the error ratio satisfies a second threshold ratio and does not satisfy a second limit ratio, increase the read level.

20. A system comprising:
means for applying a read level to a control gate of a transistor for each respective bit in a plurality of bits;
means for determining a respective value for each bit from the plurality of bits;
means for determining an error ratio that indicates a number of bits from the plurality of bits that are written as a first bit value but are incorrectly read as a second bit value relative to a number of bits from the plurality of bits that are written as the second bit value but are incorrectly read as the first bit value;

responsive to determining that the error ratio satisfies a threshold ratio, means for determining whether the error ratio satisfies a limit ratio;

responsive to determining that the error ratio does not satisfy the limit ratio, means for adjusting the read level; and responsive to determining that the error ratio satisfies the limit ratio, means for performing a read calibration.

* * * * *